United States Patent
Li

(10) Patent No.: US 9,862,865 B2
(45) Date of Patent: Jan. 9, 2018

(54) RADIATION PRE-CROSSLINKED POLYOLEFIN FILM AND PREPARATION METHOD, AND RELATED ENCAPSULATION METHOD AND ENCAPSULATION ASSEMBLY

(71) Applicant: SHANGHAI HIUV NEW MATERIALS CO., LTD., Shanghai (CN)

(72) Inventor: Min Li, Shanghai (CN)

(73) Assignee: SHANGHAI HIUV NEW MATERIALS CO., LTD., Shanghai (CN)

( * ) Notice: Subject to any disclaimer, the term of this patent is extended or adjusted under 35 U.S.C. 154(b) by 0 days.

(21) Appl. No.: 15/113,799

(22) PCT Filed: Feb. 16, 2015

(86) PCT No.: PCT/CN2015/073185
§ 371 (c)(1),
(2) Date: Jul. 22, 2016

(87) PCT Pub. No.: WO2015/124109
PCT Pub. Date: Aug. 27, 2015

(65) Prior Publication Data
US 2016/0340560 A1    Nov. 24, 2016

(30) Foreign Application Priority Data

Feb. 24, 2014  (CN) .......................... 2014 1 0061030
Feb. 24, 2014  (CN) .......................... 2014 1 0061051
Mar. 3, 2014   (CN) .................... 2014 2 0092359 U
Jan. 8, 2015   (CN) .......................... 2015 1 0010023

(51) Int. Cl.
*B32B 27/08*   (2006.01)
*C09J 131/04*  (2006.01)
(Continued)

(52) U.S. Cl.
CPC .......... *C09J 131/04* (2013.01); *B29C 35/0805* (2013.01); *B29C 35/0866* (2013.01); *B29C 39/14* (2013.01); *B29C 47/065* (2013.01); *B29C 47/145* (2013.01); *B29C 71/04* (2013.01); *B32B 3/085* (2013.01); *B32B 7/045* (2013.01); *B32B 7/12* (2013.01); *B32B 9/002* (2013.01); *B32B 9/005* (2013.01); *B32B 9/045* (2013.01); *B32B 15/08* (2013.01); *B32B 27/06* (2013.01); *B32B 27/08* (2013.01); *B32B 27/18* (2013.01); *B32B 27/304* (2013.01); *B32B 27/306* (2013.01); *B32B 27/308* (2013.01); *B32B 27/32* (2013.01); *C08J 3/24* (2013.01); *C08J 3/244* (2013.01); *C08J 3/28* (2013.01); *C08J 5/18* (2013.01); *C08J 7/123* (2013.01); *C08L 23/0853* (2013.01); *C09J 7/00* (2013.01); *H01L 31/0481* (2013.01); *H01L 51/5253* (2013.01); *B29C 47/0004* (2013.01); *B29C 47/0021* (2013.01); *B29C 2035/085* (2013.01); *B29C 2035/0844* (2013.01); *B29C 2035/0872* (2013.01); *B29C 2035/0877* (2013.01); *B29C 2035/0883* (2013.01); *B29K 2023/083* (2013.01); *B29L 2007/008* (2013.01); *B32B 2038/0076* (2013.01); *B32B 2274/00* (2013.01); *B32B 2307/31* (2013.01); *B32B 2307/412* (2013.01); *B32B 2307/732* (2013.01); *B32B 2307/734* (2013.01); *B32B 2457/00* (2013.01);
(Continued)

(58) Field of Classification Search
CPC ..... C09J 131/04; C09J 7/00; C08J 5/18; C08J 3/28; C08J 3/24; C08J 2331/04; C08J 2323/08; H01L 33/56; H01L 31/6481; H01L 51/5253; B29C 47/0004; B29C 47/2221; B29C 39/14; B29C 47/065; B29C 35/0805; B29C 35/0866; B29C 2035/0844; B29C 2035/085; B29C 2035/0872; B29C 2035/0877; B29C 2035/00; B32B 7/045; B32B 27/06; B32B 27/32; B32B 27/306
USPC ........................................................ 428/515
See application file for complete search history.

(56) References Cited

FOREIGN PATENT DOCUMENTS

CN    102604557 A    7/2012
CN    102676068 A    9/2012
(Continued)

OTHER PUBLICATIONS

Translation of CN103013364, Apr. 3, 2013.*
(Continued)

*Primary Examiner* — Hui Chin
(74) *Attorney, Agent, or Firm* — Anova Law Group, PLLC

(57) ABSTRACT

Radiation pre-crosslinked polyolefin film and preparation method, and related encapsulation method and encapsulation assembly are provided. The radiation pre-crosslinked polyolefin film for encapsulation is prepared by preparing a film after mixing polyolefin raw materials together; using a radiation energy source to irradiate the film, wherein the radiation energy source directly stimulate a crosslinking reaction of the polyolefin raw materials; adjusting an irradiation dosage of the radiation energy source, such that a crosslinking degree of a pre-crosslinked portion of the film reaches about 3 % to about 95%; and adjusting the irradiation dosage of the radiation energy source, such that the pre-crosslinked portion of the film has a thickness of about 5% to about 100% by a total thickness of the film, wherein: that the pre-crosslinked portion has the thickness of about 100% by the total thickness of the film means the film is all pre-crosslinked.

48 Claims, 1 Drawing Sheet

(51) Int. Cl.
*C08J 3/28* (2006.01)
*C08L 23/08* (2006.01)
*C08J 3/24* (2006.01)
*B29C 35/08* (2006.01)
*B29C 39/14* (2006.01)
*B29C 47/06* (2006.01)
*B32B 7/04* (2006.01)
*B32B 27/06* (2006.01)
*B32B 27/30* (2006.01)
*B32B 27/32* (2006.01)
*C08J 5/18* (2006.01)
*C09J 7/00* (2006.01)
*H01L 31/048* (2014.01)
*H01L 51/52* (2006.01)
*C08J 7/12* (2006.01)
*B29C 71/04* (2006.01)
*B29C 47/14* (2006.01)
*B32B 7/12* (2006.01)
*B32B 9/00* (2006.01)
*B32B 9/04* (2006.01)
*B32B 15/08* (2006.01)
*B32B 27/18* (2006.01)
*B32B 3/08* (2006.01)
*B29C 47/00* (2006.01)
*B29K 23/00* (2006.01)
*B29L 7/00* (2006.01)
*B32B 38/00* (2006.01)
*H01L 33/56* (2010.01)

(52) U.S. Cl.
CPC ....... *B32B 2457/12* (2013.01); *B32B 2457/20* (2013.01); *B32B 2457/206* (2013.01); *C08J 2323/08* (2013.01); *C08J 2331/04* (2013.01); *H01L 33/56* (2013.01)

(56) References Cited

FOREIGN PATENT DOCUMENTS

| CN | 103013364 A | * | 4/2013 |
|----|-------------|---|--------|
| CN | 103289582 A |   | 9/2013 |
| CN | 103804774 A |   | 5/2014 |
| CN | 103819807 A |   | 5/2014 |
| CN | 203721748 U |   | 7/2014 |

OTHER PUBLICATIONS

The World Intellectual Property Organization (WIPO) International Search Report for PCT/CN2015/073185 dated May 27, 2015 pp. 1-7.

* cited by examiner

RADIATION PRE-CROSSLINKED POLYOLEFIN FILM AND PREPARATION METHOD, AND RELATED ENCAPSULATION METHOD AND ENCAPSULATION ASSEMBLY

CROSS-REFERENCES TO RELATED APPLICATIONS

This application claims priority to PCT Application No. PCT/CN2015/073185, filed on Feb. 16, 2015, which claims priority to Chinese Patent Application No. 201410061030.3, filed on Feb. 24, 2014, Chinese Patent Application No. 201410061051.5, filed on Feb. 24, 2014, Chinese Patent Application No. 201420092359.1, filed on Mar. 3, 2014, and Chinese Patent Application No. 201510010023.5, filed on Jan. 8, 2015, the entire content of all of which is incorporated herein by reference.

FIELD OF THE DISCLOSURE

The present disclosure generally relates to the field of adhesive film and encapsulation assembly and, more particularly, relates to a polyolefin film and preparation method, and related encapsulation method and encapsulation assembly.

BACKGROUND

Encapsulation technology has been widely used in semiconductor devices, crystalline silicon solar cells, light emitting diodes (LEDs), organic light-emitting diodes (OLEDs), display screens, etc. Moreover, encapsulation films are used to adhere to the interior photovoltaic cell and to other layers in laminate structures and to protect the interior photovoltaic cell. Encapsulation films are usually made by polyolefin including ethylene-vinyl acetate (EVA) or polyolefin elastomer, which has been widely used for encapsulation.

EVA resin can be used as the sole material, plastic sheeting and hot melt adhesive. When used as a hot melt adhesive, the EVA resin that contains high weight percentage of VA (vinyl acetate) may be used, which may also has a low melting point, generally lower than 90° C. Before being used, the hot melt adhesive film, the EVA resin is made into a stick or an adhesive film that is convenient for users to process as needed. When the EVA resin contains VA having a weight percentage between 20 and 35 wt %, the EVA resin may possess excellent transparency greater than 90%, and may have desirable flexibility. Such EVA resin is ideally suited as a laminated film within double glaze or an encapsulation film for a solar module, which can buffer for the glass from being attacked or protect the very brittle solar cell chips behind the glass in the solar module. However, the EVA resin prepared to contain VA having a weight percentage between 20 and 35 wt % has a melting point between 60-80° C., lower than room temperature. It is hard for such EVA resin to maintain its dimensional stability and physical strength at room temperature for a long term. Such EVA resin has to be used after being crosslinked. In order to crosslink, thermo-crosslinking agent must be added to form an EVA resin film, which usually includes an organic peroxide, such as dicumyl peroxide (DCP), peroxy-2-ethylhexyl carbonate t-butyl ester (TBEC), etc. The EVA resin film with added thermo-crosslinking agent may be placed between the glasses in double glaze, or placed on both side of the solar cells behind the glass of solar module, vacuumed while being heated to be greater than 135° C. to melt the EVA resin to fill the gaps between the EVA resin film and the glass or between the EVA resin film and the solar cell. At the same time, EVA resin undergoes a crosslinking reaction by organic peroxide decomposition. In this stage, the crosslinking degree of EVA resin can reach 75-95%. The crosslinked EVA film is a thermoset material with elasticity without being melted and may permanently maintain the shape and strength. Usually the EVA film has not been crosslinked before used, the dimensional stability is poor, and it overflows from glass's edge after being heated, which may contaminate the equipment being used. When laying the colored and transparent EVA films up and down simultaneously, due to poor dimensional stability, the boundary of the colored and the transparent films may be unclear and interpenetrating.

A polyolefin elastomer (POE) resin refers to copolymer(s) of ethylene and butene, pentene, hexene or octene. It was first invented by Dow, which was copolymerized by octene and ethylene elastomer that possess relatively narrow molecular weight distribution and uniform short-branched chain distribution, using metallocene as catalyst. The elastomer crystalline region from ethylene chain in polyolefin elastomer is used as a physical crosslinking point, and butene, pentene, hexene, octene with long chain form amorphous rubber phase. As a result, the polyolefin elastomer has dual characteristics of rubber elasticity and thermoplasticity. The polyolefin elastomer is widely used in processing modified polyolefin such as modified polypropylene used in auto accessories, because it is well compatible with polyolefin especially polyethylene and polypropylene, and has excellent properties of weather resistance and no unsaturated bond simultaneously. The melting temperature of the polyolefin elastomer is low, usually between 50° C. - 70° C., there are almost no reports that polyolefin elastomer may be used by itself or polyolefin elastomer may be used as the main material. The polyolefin elastomer film made from the mixture of polyolefin elastomer and polyethylene compound by Dow, is served as a substitute of conventional EVA film in solar PV modules. The main component, polyolefin elastomer made from the mixture of polyethylene with high melt point and polyolefin elastomer compound with low melt point may have a melting point above 100° C. In a Chinese patent application CN103289582A, the polyolefin elastomer film can be prepared from the polyolefin elastomer by a reactive extrusion grafting step utilizing a graftable alkoxysilane-containing compound and a step adding organic peroxide. The polyolefin elastomer film may be crosslinked by organic peroxide decomposition by heating, providing heat-resistance. Due to very low melting point of the polyolefin elastomer, under the circumstance of adding polyethylene with high melting point or crosslinking agent, the melting point of the polyolefin elastomer is still very low. That the elastomer melt quickly during heating leads to inconvenience, meanwhile, low melting point causes high requirements for transportation and storage, which limits the use of the polyolefin elastomer.

Both POE film and EVA film have low melting points. The heating temperature for solar PV module's lamination is usually between 135° C. to 150° C., which is much higher than both melting points. Gradually the film melts in the lamination, and it is impossible to maintain moldability and stability, great changes may occur in the film's size and shape after lamination. For example: the two-layer film, whose size is smaller than glass, may overflow after lamination. In another example, when one of the two films is in color, after lamination the boundary is unclear and interpenetrating. The above problems have affected the final quality of the assembly or the production process.

It is important to improve the heat-resistant property of the EVA film or POE film and other polyolefin encapsulation film as hot-melt adhesive in the manufacturing process of encapsulation assembly to allow a clear interface of encapsulation.

Radiation crosslinking is a technique that uses crosslinking reaction between long chain polymers triggered by radiation. Radiation has two categories: one is ionizing radiation, which means that α (alpha), β (beta), γ (gamma), X and neutron rays, that can make a direct or indirect ionization (i.e., atoms or molecules gain or lose electrons and become ions); the other is non-ionizing radiation, such as visible light, ultraviolet light, sound radiation, heat radiation and low-energy electromagnetic radiation and so on. There is lack of binding force between molecular chains of the polymer, making it prone to deformation or damage when subjected to an external force and the ambient temperature, thus restricting its application. Crosslinking reaction forms binding sites such as chemical bonds between the polymer long chains so that the physical and chemical properties of the polymer are improved which is very effective means for polymer modification. During radiation crosslinking, there is no physical contact between the polymer and radiation generator, the shape of the polymer does not change before and after the reaction, but there is internal crosslinking reaction inside the polymer. Polymer product can be directly placed in the radiation for the crosslinking reaction. Further, crosslinking agent may be added into the polymer to promote efficiency of radiation crosslinking. However, non-ionizing radiation such as ultraviolet light has bad penetrability and limited cure depth, and moreover light initiator must be used for ultraviolet light curing. Therefore, it's difficult or impossible for partial crosslinking operation for polymer. However, radiation energy that can directly trigger polymer crosslinking reactions, such as β-rays, γ-rays, X-rays and etc. Use of radiation energy becomes more convenient, and achieves better results for partial crosslinking, since light initiator is not needed.

Radiation crosslinking is widely used in producing heat-shrinkable tube, and the plastics may have a shape memory capacity due to the crosslinking after radiation. Thus the plastic tube will return to the original shape. At room temperature the radiation-crosslinked plastic tube may be expanded, and then shrunk to its original shape while being heated. Another area in which it is commonly used is the production of automotive wire, radiation crosslinking can increase usage temperature of the automotive wire that has to be operated at a high temperature for vehicle engines.

BRIEF SUMMARY OF THE DISCLOSURE

To overcome the defects of EVA film, POE film and other polyolefin encapsulation films in the encapsulation process of encapsulation assembly, which is widely used in semiconductor devices, crystalline silicon solar cells, LEDs, OLEDs, display screens etc., the present invention provides a method for producing a radiation pre-crosslinked polyolefin film for encapsulation. The method may include: preparing a film by mixing polyolefin raw (based) materials together; using the radiation energy to irradiate the film, the radiation energy can directly stimulate the polyolefin raw (based) materials to undergo a crosslinking reaction; adjusting the irradiation dose of the radiation energy, to make the crosslinking degree of the film reach 3% to 95%; adjusting the energy of radiation, to make the film's thickness of crosslinked portion reach 5% to 100%, where 100% indicates an all crosslinked film.

In one embodiment, the method for producing a radiation pre-crosslinked polyolefin film for encapsulation includes the following steps: preparing a film after mixing polyolefin raw materials together; using the radiation energy to irradiate the film to directly stimulate the polyolefin raw materials to undergo a crosslinking reaction; adjusting the irradiation dosage of the radiation energy, to make the crosslinking degree of the film reach about 3% to about 95%; adjusting the radiation energy, to make the film thickness of crosslinked portion reach about 5% to about 100% of the film. The 100% in thickness indicates that the film is all crosslinked.

In one embodiment, the pre-crosslinked portion in the film forms at least one layer of the film surface.

In one embodiment, the radiation energy includes one of β rays, γ rays, X rays, α rays, and neutron rays.

The disclosed methods for preparing the film after mixing polyolefin raw materials together may include, but are not limited to, using a T-shaped flat mold for extruding film, or using two casting rollers for rolling into a film. For example, the film formation temperature is 70 to 200° C., and/or the mold temperature is 70 to 200° C.

The radiation energy can be adjusted to irradiate a laminated polyolefin film or an expanded polyolefin film.

In one embodiment, the polyolefin film includes an ethylene-vinyl acetate resin film. The ethylene-vinyl acetate (EVA) resin film may include, by weight, an EVA resin of about 51 parts to about 99.58 parts; an organic peroxide crosslinking agents of about 0.3 part to about 2 parts; assistant crosslinking agents of about 0.01 part to about 5 parts; antioxidants of about 0.1 part to about 2 parts; silane coupling agents of about 0.01 part to about 2 parts; pigments of about 0 to about 40 parts; and polyolefin elastomer of 0 to about 40 parts.

In one embodiment, the irradiation dosage is about 0.2 KGY to about 100 KGY. A pre-crosslinking degree of the ethylene-vinyl acetate resin film is about 5% to about 74% when 100% thickness of the film is radiation pre-crosslinked.

The radiation pre-crosslinked ethylene-vinyl acetate resin film has a single-layer, double layers, or multiple layers that are co-extruded.

The thickness of the radiation pre-crosslinked ethylene-vinyl acetate resin film is about 0.01 mm to about 2 mm. For example, the thickness is about 0.3 mm to about 0.7 mm.

The EVA resin may contain VA of about 20% to about 35% by weight, for example, the weight percentage may be about 25% to about 33% by weight.

The organic peroxide as crosslinking agents include, but are not limited to: one or more of the dialkyl peroxides, alkyl aryl peroxides, diaryl peroxides, hydrogen peroxides, diacyl peroxides, peroxy esters, ketone peroxide, peroxycarbonate, and peroxy ketals.

The assistant crosslinking agents include, but are not limited to: one or more of acrylics, methacrylics, acrylamides, allyls, and epoxy compounds.

The antioxidants include, but are not limited to: one or more of the light stabilizers, UV absorbers, and thermal oxidative aging decomposers.

The silane coupling agent is an organic silicon compound which contains two chemical groups with different chemical properties.

The pigments are additives that can change the color of the EVA film, and include, but are not limited to: one or more of carbon blacks, lithopone, zinc sulfide, titanium dioxide, ultra-fine barium sulfate, and glass beads.

The polyolefin elastomer is carbon-carbon chain resin that can be mixed with EVA, and can include one or more of the low-density polyethylene, copolymer of ethylene and butene/octene.

The polyolefin film may be a polyolefin elastomer film. The polyolefin elastomer film may include, by a weight, a polyolefin elastomer of about 69 to about 99.8 parts, assistant crosslinking agents of about 0.01 to about 5 parts, antioxidants of about 0.01 to about 2 parts, silane coupling agents of 0 to about 2 parts, organic peroxide crosslinking agents of 0 to about 2 parts, and pigments of 0 to about 20 parts. The irradiation dosage is about 10 to about 200 KGY. The pre-crosslinking degree of the polyolefin elastomer film is about 3% to about 70% when the film is radiation pre-crosslinked with entire thickness.

The thickness of radiation pre-crosslinked polyolefin elastomer film is about 0.2 mm to about 1 mm. More preferably, the thickness is about 0.3 to about 0.7 mm.

The polyolefin elastomer is one or more of the copolymers of ethylene with one or more of butene, pentene, hexene and octene.

The polyolefin elastomer may or may not be grafted by a polar group. When forming the film, the polar group is added as a small molecule additive. For example, the polar group is a silane coupling agent. For example, a silane coupling agent in elastomer may be grafted onto the elastomer molecular chain before forming the film, whose grafting ratio is less than about 3%. In one embodiment, a grafted vinyltrimethoxysilane ethylene-hexene copolymer may be formed having a grafting rate nearly about 0.6%.

The assistant crosslinking agent is a monomer with multifunctional groups, including, but not limited to: one or more of triallyl isocyanurate, cyanuric acid triallyl, trimethylol propane triacrylate, and trimethylol propane trimethacrylate.

The antioxidant refers to decomposition heat aging and UV absorbers, including, but not limited to: phenolic antioxidants, hindered amine antioxidants, phosphorous acids, benzophenone, benzotriazoles including, for example: four [β-(3,5-di-t-butyl-4-hydroxyphenylyl) propionic acid] pentaerythritol ester, sebacate (2,2,6,6-tetramethyl-4-piperidyl) ester and N,N'-di-sec-butyl-p-phenylenediamine.

The silane coupling agents are organic silicon compounds containing two chemical groups with different chemical properties, preferably KH550.

The organic peroxide crosslinking agents are thermal crosslinking organic peroxide crosslinking agents, usually used for plastics, including, but not limited to: one or more of dicumyl peroxide, peroxy-2-ethylhexyl carbonate t-butyl, and 2, 5-dimethyl-2, 5-bis (t-butylperoxy) hexyl.

The pigments are additives that can change the color of EVA film that include, but are not limited to: one or more of carbon blacks, lithopone, zinc sulfide, titanium dioxide, and glass beads.

Crosslinking part of the polyolefin film after the irradiation of radiation energy may include about 5% to 100% thickness of the polyolefin film. The 100% indicates that the film is all crosslinked in thickness. A crosslinking degree of the crosslinking part is about 3% to about 95%.

The disclosed radiation pre-crosslinked encapsulation polyolefin film may include a crosslinked portion in the film as a surface layer of the film. In one embodiment, the polyolefin film includes an ethylene-vinyl acetate resin film. The ethylene-vinyl acetate (EVA) resin film may include, by weight, an EVA resin of about 51 parts to about 99.58 parts; an organic peroxide crosslinking agents of about 0.3 part to about 2 parts; assistant crosslinking agents of about 0.01 part to about 5 parts; antioxidants of about 0.1 part to about 2 parts; silane coupling agents of about 0.01 part to about 2 parts; pigments of about 0 to about 40 parts; and polyolefin elastomer of 0 to about 40 parts.

The pre-crosslinking degree of the radiation pre-crosslinked ethylene-vinyl acetate resin film is about 5% to about 74% when the film is pre-crosslinked along an entire thickness.

The radiation pre-crosslinked ethylene-vinyl acetate resin film may include a single layer, double layers, or multiple layers that are co-extruded.

The thickness of the radiation pre-crosslinked ethylene-vinyl acetate resin film is about 0.01 mm to about 2 mm; more preferably, the thickness is about 0.3 mm to about 0.7 mm.

The ethylene-vinyl acetate resin film may contain VA having a weight percentage of about 20 to about 35% by weight, and more preferably, the weight percentage is about 25 wt % to 33 wt %.

The organic peroxide as crosslinking agents including, but are not limited to: one or more of dialkyl peroxides, alkyl aryl peroxides, diaryl peroxides, hydrogen peroxides, diacyl peroxides, peroxy esters, ketone peroxides, peroxycarbonates, and peroxy ketals.

The assistant crosslinking agents include, but are not limited to: one or more of acrylics, methacrylics, acrylamides, allyls, and epoxy compounds.

The antioxidants include, but are not limited to: one or more of light stabilizers, UV absorbers, and thermal oxidative aging decomposers.

The silane coupling agent includes organic silicon compounds and contains two chemical groups with different chemical properties.

The pigments are additives that can change the color of EVA film, and include, but are not limited to: one or more of carbon blacks, lithopone, zinc sulfide, titanium dioxide, and glass beads.

The polyolefin elastomer may be carbon-carbon chain resin that can be mixed with EVA, and include one or more of the low-density polyethylene, copolymer of ethylene and butene or octene. The polyolefin film may be polyolefin elastomer film.

The polyolefin film may be a polyolefin elastomer film. The polyolefin elastomer film may include, by a weight, a polyolefin elastomer of about 69 to about 99.8 parts, assistant crosslinking agents of about 0.01 to about 5 parts, antioxidants of about 0.01 to about 2 parts, silane coupling agents of 0 to about 2 parts, organic peroxide crosslinking agents of 0 to about 2 parts, and pigments of 0 to about 20 parts.

The pre-crosslinking degree of the polyolefin elastomer film may be about 3% to about 70% when the film is radiation pre-crosslinked in the entire thickness.

The thickness of radiation pre-crosslinked polyolefin elastomer film is about 0.2 mm to about 1 mm; and more preferably, the thickness is about 0.3 mm to about 0.7 mm.

In the disclosed radiation pre-crosslinked polyolefin film, the polyolefin elastomer includes one or more of the copolymers of ethylene and butene, pentene, hexene or octene.

The polyolefin elastomer may or may not be grafted by a polar group. When forming the film, the polar group is added as a small molecule additive. For example, the polar group is a silane coupling agent. For example, a silane coupling agent in elastomer may be grafted onto the elastomer molecular chain before forming the film, whose grafting ratio is less than about 3%. In one embodiment, a grafted vinyltrimethoxysilane ethylene-hexene copolymer may be formed having a grafting rate nearly about 0.6%.

The assistant crosslinking agent may be a monomer with multi-functional groups, that include but are not limited to: one or more of triallyl isocyanurate, cyanuric acid triallyl, trimethylol propane triacrylate, and trimethylol propane trimethacrylate.

The antioxidants refer to decomposition heating aging and UV absorbers, and include, but are not limited to: phenolic antioxidants, hindered amine antioxidants, phosphorous acids, benzophenone, benzotriazoles including, for example, four [β-(3,5-di-tert-butyl-4-hydroxyphenyl) propionic acid] pentaerythritol ester, sebacate (2,2,6,6-tetramethyl-4-piperidyl) ester, and N,N'-di-sec-butyl-p-phenylenediamine.

The silane coupling agents are organic silicon compounds containing two chemical groups with different chemical properties, preferably KH550.

The organic peroxide crosslinking agents are thermal crosslinking organic peroxide crosslinking agents, usually used for plastics, which include but are not limited to: one or more of dicumyl peroxide, peroxy-2-ethylhexyl carbonate t-butyl, and 2, 5-dimethyl-2, 5-bis (t-butylperoxy) hexyl.

The pigments are additives that can change the color of EVA film, and include, but are not limited to: one or more of carbon blacks, lithopone, zinc sulfide, titanium dioxide, and glass beads.

An encapsulation method using the radiation pre-crosslinked polyolefin film may include the following steps: preparing a film after mixing polyolefin raw material together; using the radiation energy to irradiate the film, the radiation energy directly stimulating the polyolefin raw materials to undergo a crosslinking reaction; adjusting the irradiation dosage of the radiation energy, to make the crosslinking degree of the film of about 5% to about 95%; adjusting the radiation energy, to make the film thickness of crosslinked portion from about 5% to about 100% of the film, 100% indicating that the film is all crosslinked in thickness; placing the film between a front protective layer and an encapsulation substrate, and constructing encapsulation assembly with an encapsulated body, the pre-crosslinked portion of the film being in contact with the encapsulated body; and heating the encapsulation assembly, to further crosslink the film and to complete the process of the encapsulation.

The pre-crosslinked portion in the film forms a layer of the film surface.

The radiation energy is the one of β rays, γ rays, X rays, α-rays, and neutron rays.

The methods for preparing the film after mixing polyolefin raw materials together include, but are not limited to: using a T-shaped flat mold for extruding film, or using two casting rollers for rolling to form the film.

The film formation temperature is about 70 to about 200° C., and the mold temperature is about 70 to about 200° C.

In the disclosed encapsulation method using radiation pre-crosslinked polyolefin film, the radiation may irradiate the laminated polyolefin film or the expanded polyolefin film.

In one embodiment, the polyolefin film includes an ethylene-vinyl acetate resin film. The ethylene-vinyl acetate (EVA) resin film may include, by weight, an EVA resin of about 51 parts to about 99.58 parts; an organic peroxide crosslinking agents of about 0.3 part to about 2 parts; assistant crosslinking agents of about 0.01 part to about 5 parts; antioxidants of about 0.1 part to about 2 parts; silane coupling agents of about 0.01 part to about 2 parts; pigments of about 0 to about 40 parts; and polyolefin elastomer of 0 to about 40 parts.

The irradiation dosage is about 0.2 KGY to about 100 KGY.

The pre-crosslinking degree of the ethylene-vinyl acetate resin film is about 5% to about 74% when the film is pre-crosslinked through the entire thickness.

The radiation pre-crosslinked ethylene-vinyl acetate resin film includes a single-layer, double layers, or multiple layers that are co-extruded.

The thickness of the radiation pre-crosslinked ethylene-vinyl acetate resin film is about 0.01 mm to about 2 mm; and more preferably, the thickness is about 0.3 mm to about 0.7 mm.

The polyolefin film is a polyolefin elastomer film.

The polyolefin film may be a polyolefin elastomer film. The polyolefin elastomer film may include, by a weight, a polyolefin elastomer of about 69 to about 99.8 parts, assistant crosslinking agents of about 0.01 to about 5 parts, antioxidants of about 0.01 to about 2 parts, silane coupling agents of 0 to about 2 parts, organic peroxide crosslinking agents of 0 to about 2 parts, and pigments of 0 to about 20 parts. The irradiation dosage is about 10 to about 200 KGY. The pre-crosslinking degree of the polyolefin elastomer film is about 3% to about 70% when the film is radiation pre-crosslinked with entire thickness.

The thickness of radiation pre-crosslinked polyolefin elastomer film is about 0.2 mm to about 1 mm; and more preferably, the thickness is about 0.3 to about 0.7 mm.

The polyolefin elastomer may be one or more of the copolymers of ethylene and butene, pentene, hexene or octene.

When heating the encapsulation assembly, the encapsulation assembly may be pressured or vacuumed for the encapsulation.

The encapsulated body may include, but be not limited to: crystalline silicon solar cells, LEDs, OLEDs, display devices, etc.

The encapsulation method using radiation pre-crosslinked polyolefin film may include: placing a film including two layers between the front protective layer and the encapsulation substrate, and at least one of the two films is the pre-crosslinked film, and placing the encapsulated body between the two layers of the film.

The front protective layer may be a transparent protective layer, in particular is a transparent glass, a transparent ceramic or a transparent plastic.

The film may include a layer of EVA (ethylene-vinyl acetate resin) film and a layer of pre-crosslinking EVA film, and the EVA film is placed on or adjacent to the front protective layer.

In one embodiment, both of the two layers of film are pre-crosslinking POE (polyolefin elastomer) films.

The radiation pre-crosslinked polyolefin film is placed between a front protective layer and encapsulation substrate, the encapsulation assembly is constructed with the encapsulated body, and the pre-crosslinked portion of the film is in contact with the encapsulated body.

The encapsulated body includes, but is not limited to: crystalline silicon solar cells, LEDs, OLEDs, display devices, etc.

In an exemplary encapsulation assembly, a film including two layers is placed between the front protective layer and the encapsulation substrate, at least one of the two films is the pre-crosslinked film. The encapsulated body is placed between the two layers of the film.

The front protective layer is a transparent protective layer, in particular, a transparent glass, a transparent ceramic, or a transparent plastic.

In one embodiment, the film include a layer of EVA (ethylene-vinyl acetate resin) film and a layer of pre-crosslinked EVA film, and the EVA film is placed on or adjacent to the front protective layer.

Both of the two layers of film are pre-crosslinking POE (polyolefin elastomer) films. The encapsulation substrate includes glass, ceramic, plastic, etc.

The present disclosure provides following advantages and beneficial effects.

The present disclosure provides a pre-crosslinked polyolefin film by high-energy rays. Since the polyolefin film is formed by a crosslinking reaction, the dimensional stability and heat-resistance of the film are greatly improved, as compared with the non-crosslinked film.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
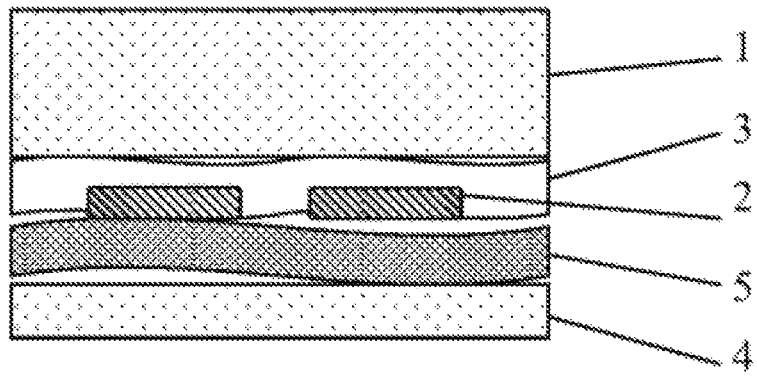
FIG. 1 illustrates an exemplary encapsulation assembly using radiation pre-crosslinked polyolefin film in accordance with various embodiments in the present disclosure.

Reference will now be made in detail to exemplary embodiments of the disclosure, which are illustrated in the accompanying drawings. Wherever possible, the same reference numbers will be used throughout the drawings to refer to the same or like parts.

Embodiment 1

| Ingredient | Weight percentage |
| --- | --- |
| Ethylene - butene copolymer | 99 |
| 3-aminopropyltriethyloxy silane (KH550) | 0.4 |
| triallyl isocyanurate (TAIC) | 0.5 |
| 4 [β-(3,5-di-t-butyl-4-hydroxyphenyl) propionate] pentaerythritol (anti-oxide agent 1010) | 0.1 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked film's thickness is 0.3 mm, the length is 100 m for a single reel. A 3-inch paper core is used to reel the uncrosslinked film up.

A reel or multiple reels of the uncrosslinked film are expanded and placed under an X-ray generator. The radiation dosage of irradiation is 200 KGY. After the irradiation, the thickness of the pre-crosslinked film takes 100% of the total thickness of the film. The degree of crosslinking of the film is measured to be in the range of 60%-70%. The pre-crosslinked film is cut into pieces according to the size of the double-glazing and placed between the double-glazing, vacuumed and pressurized, and then heated to 200° C. for 10 minutes. The resulting degree of crosslinking can reach to more than 95%. The adhesive force between the pre-crosslinked film and glass is more than 75 N/cm. This pre-crosslinked film overflows out of the edge of the double-glazing for less than 5 mm.

Five pieces of A4-sized pre-crosslinked films and five pieces of A4-sized uncrosslinked films are respectively folded and placed in an oven at 35° C. Weights of 1000 g are placed on the films. After 24 hours, the pre-crosslinked films and uncrosslinked films are taken out to compare the adhesions there-between. As the result, the adhesion between the radiation pre-crosslinked films is remarkably less than that of the un-crosslinked films.

Five pieces of stripe-shaped pre-crosslinked films (1 cm×15 cm) and five pieces of stripe-shaped uncrosslinked films (1 cm×15 cm) are compared in tensile-strength. As the result, the tensile-strength of radiation crosslinked films is higher than that of the un-crosslinked films.

Embodiment 2

| Ingredient | Weight percentage |
| --- | --- |
| Ethylene-hexene copolymer grafted by vinyl-trimethoxy-silican(A-171), grafting 0.6% | 58 |
| Titanium dioxide | 40 |
| TMPTMA | 1 |
| Butylperoxy-2-ethylhexyl carbonate tert-butyl (TBEC) | 0.8 |
| Sebacate (2,2,6,6-tetramethyl-4-piperidyl) ester (Anti-oxide agent 770) | 0.2 |

The above-mentioned components are fully mixed and put into the extruder. The temperature of the extruder is 90° C., and the temperature of the mold is 90° C. The mixed components are extruded into a film by a T-shaped flat mold, or are directly rolled into a film using two casting rollers. The film is then reeled up. The obtained uncrosslinked film's thickness is 0.6 mm, the length is 100 m for a single reel. A 3-inch paper core is used to reel the uncrosslinked film up.

A reel or multiple reels of the uncrosslinked film are expanded and placed under a β-ray generator having electronic accelerator energy of 10 MeV, and having a radiation dosage of 100 KGY. After the irradiation, the thickness of the pre-crosslinked film takes 100% of the total thickness of the film. The degree of crosslinking of the film is measured to be in the range of 50%-70%. The pre-crosslinked film is cut into pieces according to the size of the double-glazing and placed between the double-glazing, vacuumed and pressurized, and then heated to 200° C. for 10 minutes. The resulting degree of crosslinking can reach to more than 95%. The adhesive force between the pre-crosslinked film and glass is more than 75 N/cm.

Five pieces of A4-sized pre-crosslinked films and five pieces of A4-sized uncrosslinked films are respectively folded and placed in an oven at 35° C. Weights of 1000 g are placed on the films. After 24 hours, the pre-crosslinked films and uncrosslinked films are taken out to compare the adhesions there-between. As the result, the adhesion between the radiation pre-crosslinked films is remarkably less than that of the un-crosslinked films.

Five pieces of stripe-shaped pre-crosslinked films (1 cm×15 cm) and five pieces of stripe-shaped uncrosslinked films (1 cm×15 cm) are compared in tensile-strength. As the result, the tensile-strength of radiation crosslinked films is higher than that of the un-crosslinked films.

Embodiment 3

| Ingredient | Weight percentage |
|---|---|
| Ethylene-octene copolymer | 40 |
| Ethylene- hexene copolymer | 40 |
| zinc sulfide | 16.5 |
| Triallyl isocyanurate (TAIC) | 1 |
| 3-aminopropyl triethoxysilane (KH550) | 1 |
| Dicumyl peroxide (DCP) | 1 |
| N,N'-disuccinic sec-butyl-p-phenylenediamine (anti-oxide agent 4720) | 0.5 |

The above-mentioned components are fully mixed and put into the extruder. The temperature of the extruder is 90° C., and the temperature of the mold is 90° C. The mixed components are extruded into a film by a T-shaped flat mold, or are directly rolled into a film using two casting rollers. The film is then reeled up. The obtained uncrosslinked film's thickness is 0.7 mm, the length is 20 m for a single reel. A 3-inch paper core is used to reel the uncrosslinked film up.

A reel or multiple reels of the uncrosslinked film are expanded and placed under a β-ray generator having electronic accelerator energy of 5 MeV, and having a radiation dosage of 10 KGY. After the irradiation, the thickness of the pre-crosslinked film takes 100% of the total thickness of the film. The degree of crosslinking of the film is measured to be in the range of 3%-9%. The pre-crosslinked film is cut into pieces according to the size of the double-glazing and placed between the double-glazing, vacuumed and pressurized, and then heated to 200° C. for 10 minutes. The resulting degree of crosslinking can reach to more than 95%. The adhesive force between the pre-crosslinked film and glass is more than 90 N/cm.

Five pieces of A4-sized pre-crosslinked films and five pieces of A4-sized uncrosslinked films are respectively folded and placed in an oven at 35° C. Weights of 1000 g are placed on the films. After 24 hours, the pre-crosslinked films and uncrosslinked films are taken out to compare the adhesions there-between. As the result, the adhesion between the radiation pre-crosslinked films is remarkably less than that of the un-crosslinked films.

Five pieces of stripe-shaped pre-crosslinked films (1 cm×15 cm) and five pieces of stripe-shaped uncrosslinked films (1 cm×15 cm) are compared in tensile-strength. As the result, the tensile-strength of radiation crosslinked films is higher than that of the un-crosslinked films.

Embodiment 4

| Ingredient | Weight percentage |
|---|---|
| Ethylene-hexene copolymer | 94 |
| 3-aminopropyl triethoxysilane (KH550) | 0.4 |
| Titanium dioxide | 5 |
| Triallyl isocyanurate (TAIC) | 0.5 |
| 4 [β-(3,5-di-t-butyl-4-hydroxyphenyl) propionate] pentaerythritol (anti-oxide agent 1010) | 0.1 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked film's thickness is 0.6 mm, the length is 400 m for a single reel. A 3-inch paper core is used to reel the uncrosslinked film up.

A reel or multiple reels of the uncrosslinked film are expanded and placed under a γ-ray generator, then reeled onto another 3-inch paper core, and then radiated at a radiation dosage of 200 KGY. After the irradiation, the thickness of the pre-crosslinked film takes 100% of the total thickness of the film. The degree of crosslinking of the film is measured to be in the range of 60%-68%. The pre-crosslinked film is placed on a backside of the double glazing solar module cells. The crosslinked surface is placed to the side of the cell, and the uncrosslinked surface is placed under and in contact with the lower layer of the glass. The front of the cell is covered with a normal transparent polyolefin elastomer film. After placing the formed solar module cells with the pre-crosslinked film between two pieces of glass having a same size, together the entire workpiece is then placed into a laminating machine used to produce the solar photovoltaic modules, vacuumed for 6 minutes, meanwhile heated to 200° C., and pressurized for 15 minutes, until the resulting degree of cross-linking can reach more than 95%. In the laminated layer, the pulling force between the pre-crosslinked film and glass is greater than 50 N/cm. The interface between the pre-cross-linked film and the transparent polyolefin elastomer film that is on the cell is clear. The lower film of the pre-crosslinked film does not migrate to the top surface of the cell of the solar module cell.

Embodiment 5

The formula of EVA film is shown in the table below.

| Ingredient | Weight percentage |
|---|---|
| EVA resin, VA content 25% | 51.5 |
| Ethylene - butene copolymer polyolefin elastomer | 40 |
| Titanium dioxide | 5 |
| Trimethylol propane trimethacrylate (TMPTA) | 1 |
| Dicumyl peroxide | 1 |
| 4 [β-(3,5-di-t-butyl-4-hydroxyphenyl) propionate] pentaerythritol (anti-oxide agent 1010) | 1 |
| Vinyltrimethoxysilane (Silane coupling agent A-171) | 0.5 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked EVA film's thickness is 0.1 mm, and the length is 100 m for a single reel. A 3-inch paper core is used to reel the uncrosslinked EVA film up.

The reeled EVA film is expanded and placed under a β-ray generator, then reeled onto another 3-inch paper core, and then irradiated by an electron beam having accelerator energy of 100 keV and electron beam radiation dosage of 0.2 KGY. Radiation pre-crosslinked film is obtained after radiation. The thickness of the pre-crosslinked film takes 50% of the total thickness of the film. The pre-crosslinked EVA film is placed on a backside of the double glazing solar module cells. The crosslinked surface is placed to the side of the cell, and the uncrosslinked surface is placed under and in contact with the lower layer of the glass. The front side of the cell is covered with a normal transparent EVA film. After placing the formed solar module cells with the pre-crosslinked EVA film between two pieces of glass having a same size, together the entire workpiece is then placed into a laminating machine used to produce the solar photovoltaic modules, vacuumed for 6 minutes, meanwhile heated to 150° C., and pressurized and laminated for 15 minutes. In the laminated layer, the pulling force between the pre-crosslinked EVA film and glass is greater than 70 N/cm. The interface between the pre-crosslinked EVA film and the transparent EVA film that is on the cell is clear. The lower film of the pre-crosslinked film does not migrate to the top surface of the cell of the solar module cell.

Embodiment 6

This embodiment includes double-layer-coextruded EVA film having one transparent EVA layer and one black EVA layer. The formula of each of two EVA layers is shown below.

| Ingredient | Weight percentage |
| --- | --- |
| Transparent EVA layer ingredient | |
| EVA resin, VA content 33% | 97 |
| Triallyl isocyanurate (TAIC) | 1 |
| 2,5-dimethyl-2,5-bis (tert-butylperoxy) hexane | 0.5 |
| N,N'-disuccinic sec-butyl-p-phenylenediamine (anti-oxide agent 4720) | 0.5 |
| 2-(2H-benzotriazole-2)-4,6-2(1-methyl-1-phenylethyl) phenol | 0.2 |
| Vinyltrimethoxysilane (Silane coupling agent A-171) | 0.8 |
| Black EVA layer ingredient | |
| EVA resin, VA content 28% | 92.8 |
| Carbon black | 5 |
| Triallyl isocyanurate (TAIC) | 0.4 |
| 2,5-dimethyl-2,5-bis (tert-butylperoxy) hexane | 0.5 |
| N,N'-disuccinic sec-butyl-p-phenylenediamine (anti-oxide agent 4720) | 0.5 |
| Vinyltrimethoxysilane (Silane coupling agent A-171) | 0.8 |

The fully mixed transparent EVA layer component and the fully mixed black EVA layer component are added into two barrels of double layer coextruding extruder set (including two extruders), the temperature of the extrusion is 100° C., the temperature of distributor is 100° C. and the temperature of the mold is 102° C. The mixture is melted by the extruder, entered into the distributor and the T-shaped flat mold to form an EVA film, which is then reeled up.

The uncrosslinked EVA film is expanded and placed under a β-ray generator. The transparent EVA layer in the EVA film faces the β-ray generator for radiation. After the irradiation, 3-inch paper core is used to reel the EVA film. The radiation pre-crosslinked EVA resin co-extruded film is then obtained. The EVA film has a film thickness of 0.7 mm and a single roll length of 300 m. The accelerator energy is 500 keV and the radiation dosage is 50 KGY. The thickness of the pre-crosslinked portion is 100% of the total thickness of the film. The two layers of the pre-crosslinked EVA film are carefully separated by a knife and the crosslinking degree of the transparent layer is measured and the crosslinking degree reaches between 45%-55%. The EVA film is cut into a size of photovoltaic module. A layered structure of glass/cells/double-layer co-extruded EVA film/back sheet are vacuumed and laminated under 148° C. having a vacuum time of 5 minutes and the laminating time of 12 minutes. After laminating, a photovoltaic module, viewed black from glass side to the bottom side and viewed white from back sheet side to a side, is obtained. The interface between black surface and transparent surface has not turnover or other exterior defects.

Embodiment 7

The formula of EVA film is shown below.

| Ingredient | Weight percentage |
| --- | --- |
| EVA resin, VA content 25% | 60 |
| Ethylene - butene copolymer polyolefin elastomer | 31.5 |
| Titanium dioxide | 5 |
| Trimethylol propane trimethacrylate (TMPTA) | 1 |
| Dicumyl peroxide | 1 |
| 4 [β-(3,5-di-t-butyl-4-hydroxyphenyl) propionate] pentaerythritol (anti-oxide agent 1010) | 1 |
| Vinyltrimethoxysilane (Silane coupling agent A-171) | 0.5 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked film's thickness is 2 mm, and a single reel length is 200 m. A 3-inch paper core is used to reel the uncrosslinked EVA film up.

The uncrosslinked EVA film is expanded and placed under a β-ray generator, and then reeled to another 3-inch paper core. The radiation is electron beam radiation having accelerator energy of 300 keV and an electron beam radiation dosage of 30 KGY. The radiation pre-crosslinked film is obtained after radiation. The film thickness of the pre-crosslinked portion is 30% of the total thickness of the film. The crosslinking degree of the film is measured in a range between 25%-35%. The pre-crosslinked film is cut into pieces having a size of the double-glazing and placed between the double-glazing, vacuumed and pressurized, and then heated to 200° C. for 10 minutes. The adhesive force between the EVA film and glass is larger than 60 N/cm. The EVA film overflows out of the edge of the double-glazing glass is smaller than 5 mm.

Embodiment 8

The formula of EVA film is shown below.

| Ingredient | Weight percentage |
| --- | --- |
| EVA resin, VA content 28% | 78 |
| Ultrafine barium sulfate | 19.5 |
| Cyanuric acid triallyl (TAC) | 0.5 |
| Butylperoxy-2-ethylhexyl carbonate tert-butyl (TBEC) | 1 |
| Sebacate (2,2,6,6-tetramethyl-4-piperidyl) ester (Anti-oxide agent 770) | 0.5 |
| 3-methacryloxypropyl trimethoxy silane (A-174) | 0.5 |

The above-mentioned components are fully mixed and put into the extruder. The temperature of the extruder is 90° C., and the temperature of the mold is 90° C. The mixed components are extruded into a film by a T-shaped flat mold, or are directly rolled into a film using two casting rollers. The film is then reeled up. The obtained uncrosslinked film's thickness is 0.1 mm, a single reel length is 20 m. A 3-inch paper core is used to reel the uncrosslinked EVA film up.

A reel or multiple reels of the uncrosslinked EVA film are expanded and placed under a β-ray generator having electronic accelerator energy of 500 keV, and having a radiation dosage of 100 KGY. After the irradiation, the thickness of the pre-crosslinked film takes 100% of the total thickness of the film. The degree of crosslinking of the film is measured to be in the range of 53%-74%. The pre-crosslinked EVA film is placed on a backside of the double glazing solar module cells. The front side of the cell is covered with a normal transparent EVA film. After placing the formed solar module cells with the pre-crosslinked EVA film between two pieces of glass having a same size, together the entire workpiece is then placed into a laminating machine used to produce the solar photovoltaic modules, vacuumed for 6 minutes, meanwhile heated to 150° C., and pressurized and laminated for 15 minutes. In the laminated layer, the pulling force between the pre-crosslinked EVA film and glass is greater than 70 N/cm. The interface between the pre-crosslinked EVA film and the transparent EVA film that is on the cell is clear. The lower film of the pre-crosslinked film does not migrate to the top surface of the cell of the solar module cell.

Embodiment 9

The formula of EVA film is shown below.

| Ingredient | Weight percentage |
| --- | --- |
| EVA resin, VA content 33% | 92.5 |
| Carbon black | 5 |
| Triallyl isocyanurate (TAIC) | 1 |
| 2,5-dimethyl-2,5-bis (tert-butylperoxy) hexane | 0.5 |
| N,N'-disuccinic sec-butyl-p-phenylenediamine (anti-oxide agent 4720) | 0.5 |
| Vinyltrimethoxysilane (Silane coupling agent A-171) | 0.5 |

The above-mentioned components are fully mixed and put into the extruder. The temperature of the extruder is 100° C., and the temperature of the mold is 102° C. The mixed components are extruded into a film by a T-shaped flat mold and then reeled up. The obtained uncrosslinked EVA film's thickness is 0.7 mm, and a single reel length is 300 m. A 3-inch paper core is used to reel the uncrosslinked EVA film up.

A reel or multiple reels of the uncrosslinked EVA film are expanded and placed under a α-ray generator, irradiated having a radiation dosage of 100 KGY to form a radiation pre-crosslinked film after radiation. The film thickness of the pre-crosslinked portion is 100% of the total thickness of the film. The crosslinking degree of the EVA film is measured in a range between 35%-55%. The pre-crosslinked EVA film is cut into the size of the double-glazing and placed between the double-glazing, vacuumed, pressurized to laminate, and then heated to 150° C. for 10 minutes, and the crosslinking degree reaches 82%-90%.

Five pieces of pre-crosslinked films and five pieces of uncrosslinked films are respectively folded and placed in an oven at 35° C. Weights of 1000 g are placed on the two stacks of films. After 40 hours, the pre-crosslinked films and uncrosslinked films are taken out. The five stacked pre-crosslinked films may be easily separated, while the five stacked un-crosslinked films with the same formula as for the crosslinked films is seriously adhered together.

Embodiment 10

The formula of EVA film is shown below.

| Ingredient | Weight percentage |
| --- | --- |
| EVA resin, VA content 28% | 78 |
| Ultrafine barium sulfate | 19.5 |
| Cyanuric acid triallyl (TAC) | 0.5 |
| Butylperoxy-2-ethylhexyl carbonate tert-butyl (TBEC) | 1 |
| Sebacate (2,2,6,6-tetramethyl-4-piperidyl) ester (Anti-oxide agent 770) | 0.5 |
| 3-methacryloxypropyl trimethoxy silane (A-174) | 0.5 |

The above-mentioned components are fully mixed and put into the extruder. The temperature of the extruder is 90° C., and the temperature of the mold is 90° C. The mixed components are extruded into a film by a T-shaped flat mold and then reeled up. The obtained uncrosslinked EVA film's thickness is 0.1 mm, and a single reel length is 100 m. A 3-inch paper core is used to reel the uncrosslinked EVA film up.

The reeled EVA film is expanded and placed under the α-ray generator, and then reeled onto another 3-inch paper core. The radiation is α-ray radiation having a radiation dosage of 0.2 KGY. After the radiation, the thickness of the film on the pre-crosslinked portion is 80% of the total thickness of the film. Since the film is too thin and hard to be peeled off. The crosslinking degree of the whole film is measured and the whole crosslinking degree of the EVA film is between 10%-18%. The pre-crosslinked film is cut into a size of the double-glazing and placed between the double-glazing, vacuumed and pressurized to laminate, and then heated to 150° C. for 10 minutes. The adhesive force between EVA film and glass is larger than 80 N/cm. The EVA film overflows out of the edge of the double-glazing for smaller than 2 mm.

Embodiment 11

The formula of EVA film is shown below.

| Ingredient | Weight percentage |
| --- | --- |
| EVA resin, VA content 25% | 91.5 |
| Titanium dioxide | 5 |
| Trimethylol propane trimethacrylate (TMPTA) | 1 |
| Dicumyl peroxide (DCP) | 1 |
| 4 [β-(3,5-di-t-butyl-4-hydroxyphenyl) propionate] pentaerythritol (anti-oxide agent 1010) | 1 |
| Vinyltrimethoxysilane (Silane coupling agent A-171) | 0.5 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked EVA film's thickness is 0.5 mm, and a single reel length is 20 m. A 3-inch paper core is used to reel the uncrosslinked EVA film up.

The reeled EVA film is expanded and placed under an x-ray generator, then reeled onto another 3-inch paper core, and then irradiated by x-ray having irradiation dosage of 0.2 KGY. Radiation pre-crosslinked film is obtained after radiation. The thickness of the pre-crosslinked film takes 40% of the total thickness of the film. A top layer of 0.2 mm is used for measuring degree of crosslinking. The degree of crosslinking of the film is measured to be in the range of 11%-18%. The pre-crosslinked EVA film is placed on a backside of the double glazing solar module cells. The crosslinked surface is placed to the side of the cell, and the uncrosslinked surface is placed under and in contact with the lower layer of the glass. The front side of the cell is covered with a normal transparent EVA film. After placing the formed solar module cells with the pre-crosslinked EVA film between two pieces of glass having a same size, together the entire workpiece is then placed into a laminating machine used to produce the solar photovoltaic modules, vacuumed for 6 minutes, meanwhile heated to 150° C., and pressurized and laminated for 15 minutes. In the laminated layer, the pulling force between the pre-crosslinked EVA film and glass is greater than 70 N/cm. The interface between the pre-crosslinked EVA film and the transparent EVA film that is on the cell is clear. The lower film of the pre-crosslinked film does not migrate to the top surface of the cell of the solar module cell.

Embodiment 12

The formula of EVA film is shown below.

| Ingredient | Weight percentage |
| --- | --- |
| EVA resin, VA content 25% | 91.5 |
| Titanium dioxide | 5 |
| Trimethylol propane trimethacrylate (TMPTA) | 1 |
| Dicumyl peroxide (DCP) | 1 |
| 4 [β-(3,5-di-t-butyl-4-hydroxyphenyl) propionate] pentaerythritol (anti-oxide agent 1010) | 1 |
| Vinyltrimethoxysilane (Silane coupling agent A-171) | 0.5 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked film's thickness is 0.5-mm, and a single reel length is 20 m. A 3-inch paper core is used to reel the uncrosslinked EVA film up.

The uncrosslinked EVA film is expanded and placed under γ-ray generator, and then reeled to another 3-inch paper core. The radiation is γ-ray radiation having a radiation dosage of 0.2 KGY. The radiation pre-crosslinked film is obtained after radiation. The film thickness of the pre-crosslinked portion is 50% of the total thickness of the film. A top layer of 0.2 mm is used for measuring degree of crosslinking. The degree of crosslinking of the film is measured to be in the range of 15%-22%. The pre-crosslinked EVA film is placed on a backside of the double glazing solar module cells. The crosslinked surface is placed to the side of the cell, and the uncrosslinked surface is placed under and in contact with the lower layer of the glass. The front side of the cell is covered with a normal transparent EVA film. After placing the formed solar module cells with the pre-crosslinked EVA film between two pieces of glass having a same size, together the entire workpiece is then placed into a laminating machine used to produce the solar photovoltaic modules, vacuumed for 6 minutes, meanwhile heated to 150° C., and pressurized and laminated for 15 minutes. In the laminated layer, the pulling force between the pre-crosslinked EVA film and glass is greater than 70 N/cm. The interface between the pre-crosslinked EVA film and the transparent EVA film that is on the cell is clear. The lower film of the pre-crosslinked film does not migrate to the top surface of the cell of the solar module cell.

Embodiment 13

| Ingredient | Weight percentage |
| --- | --- |
| EVA resin, VA content 25% | 93 |
| Titanium dioxide | 5 |
| Trimethylol propane trimethacrylate (TMPTA) | 1 |
| Butylperoxy-2-ethylhexyl carbonate tert-butyl (TBEC) | 0.8 |
| Sebacate (2,2,6,6-tetramethyl-4-piperidyl) ester (Anti-oxide agent 770) | 0.2 |

The above-mentioned components are fully mixed and put into the extruder. The temperature of the extruder is 90° C., and the temperature of the mold is 90° C. The mixed components are extruded into a film by a T-shaped flat mold, or are directly rolled into a film using two casting rollers. The film is then reeled up. The obtained uncrosslinked film's thickness is 0.2 mm, and a single reel length is 50 m. A 6-inch paper core is used to reel the uncrosslinked film up.

A reel or multiple reels of the uncrosslinked film are expanded and placed under β-ray generator having electronic accelerator energy of 5 MeV, and having a radiation dosage of 15 KGY. After the irradiation, the thickness of the pre-crosslinked film takes 100% of the total thickness of the film. The degree of crosslinking of the film is measured to be in the range of 12%-29%. The pre-crosslinked film is cut into pieces according to the size of the double-glazing and placed between the double-glazing, vacuumed and pressurized, and then heated to 150° C. for 10 minutes. The resulting degree of crosslinking can reach to more than 95%. The adhesive force between the pre-crosslinked film and glass is more than 75 N/cm.

Five pieces of A4-sized pre-crosslinked films and five pieces of A4-sized uncrosslinked films are respectively folded and placed in an oven at 35° C. Weights of 1000 g are placed on the films. After 24 hours, the pre-crosslinked films and uncrosslinked films are taken out to compare adhesions between layers. As the result, the pre-crosslinked films are much less adhered with each other compared with un-crosslinked films.

Five pieces of stripe-shaped pre-crosslinked films (1 cm×15 cm) and five pieces of stripe-shaped uncrosslinked films (1 cm×15 cm) are compared in tensile-strength. As the result, the tensile-strength of radiation crosslinked films is higher than that of the un-crosslinked films.

Embodiment 14

| Ingredient | Weight percentage |
| --- | --- |
| EVA resin, VA content 28% | 80 |
| Zinc sulfide | 16.5 |
| Triallyl isocyanurate (TAIC) | 1 |
| 3-aminopropyl triethoxysilane (KH550) | 1 |
| Dicumyl peroxide (DCP) | 1 |
| N,N'-disuccinic sec-butyl-p-phenylenediamine (anti-oxide agent 4720) | 0.5 |

The above-mentioned components are fully mixed and put into the extruder. The temperature of the extruder is 90° C., and the temperature of the mold is 90° C. The mixed components are extruded into a film by a T-shaped flat mold, or are directly rolled into a film using two casting rollers. The film is then reeled up. The obtained uncrosslinked film's thickness is 0.5 mm, and a single reel length is 30 m. A 3-inch paper core is used to reel the uncrosslinked film up.

A reel or multiple reels of the uncrosslinked film are expanded and placed under β-ray generator having electronic accelerator energy of 10 MeV, and having a radiation dosage of 35 KGY. After the irradiation, the thickness of the pre-crosslinked film takes 100% of the total thickness of the film. The degree of crosslinking of the film is measured to be in the range of 20%-50%. The pre-crosslinked film is cut into pieces according to the size of the double-glazing and placed between the double-glazing, vacuumed and pressurized, and then heated to 150° C. for 10 minutes. The resulting degree of crosslinking can reach to more than 90%.

Five pieces of A4-sized pre-crosslinked films and five pieces of A4-sized uncrosslinked films are respectively folded and placed in an oven at 35° C. Weights of 1000 g are placed on the films. After 24 hours, the pre-crosslinked films and uncrosslinked films are taken out to compare adhesions between layers. As the result, the pre-crosslinked films are much less adhered with each other compared with un-crosslinked films.

Five pieces of stripe-shaped pre-crosslinked films (1 cm×15 cm) and five pieces of stripe-shaped uncrosslinked films (1 cm×15 cm) are compared in tensile-strength. As the result, the tensile-strength of radiation crosslinked films is higher than that of the un-crosslinked films.

Embodiment 15

| Ingredient | Weight percentage |
| --- | --- |
| Ethylene-hexene copolymer grafted by vinyl-trimethoxy-silican, grafting 0.6% | 98 |
| TMPTMA | 1 |
| Butylperoxy-2-ethylhexyl carbonate tert-butyl (TBEC) | 0.8 |
| Sebacate (2,2,6,6-tetramethyl-4-piperidyl) ester (Anti-oxide agent 770) | 0.2 |

The above-mentioned components are fully mixed and put into the extruder. The temperature of the extruder is 110° C., and the temperature of the mold is 110° C. The mixed components are extruded into a film by a T-shaped flat mold, or are directly rolled into a film using two casting rollers. The film is then reeled up. The obtained uncrosslinked film's thickness is 0.01 mm, and a single reel length is 20 m. A 6-inch paper core is used to reel the uncrosslinked polyolefin elastomer film up.

The reeled uncrosslinked polyolefin elastomer film are expanded and placed under β-ray generator and then reeled onto another 6-inch paper core. The irradiation includes electron beam having electronic accelerator energy of 100 MeV, and having a radiation dosage of 20 KGY. After the irradiation, the thickness of the pre-crosslinked film takes 100% of the total thickness of the film. The degree of crosslinking of the film is measured to be in the range of 21%-28%. Sequentially stacking an opposite substrates (glass substrate having a thickness of 150 μm)/pre-crosslinked polyolefin elastomer film/organic EL element/substrate (DuPont Teijin Ltd., trade name MelinexS, thickness of 100 μm) to form a laminated body, the crosslinked surface of the pre-crosslinked polyolefin elastomer membrane is placed to the side of organic EL element, the uncrosslinked surface is disposed on the side of opposite substrate in contact with the substrate. The laminated body as a whole is then placed in the vacuum laminating machine that produces the EL display, heated to 100° C., and pressurized to laminate for one hour. In the laminated material, the drawing force between pre-crosslinked polyolefin elastomer film and the glass substrate is greater than 70 N/cm. The polyolefin elastomer film that overflows the edge of the double-layer substrate is less than 2 mm.

Embodiment 16

| Ingredient | Weight percentage |
| --- | --- |
| EVA resin, VA content 25% | 60 |
| Ethylene - butene copolymer polyolefin elastomer | 31.5 |
| Titanium dioxide | 5 |
| Trimethylol propane trimethacrylate (TMPTA) | 1 |
| Dicumyl peroxide | 1 |
| 4 [β-(3,5-di-t-butyl-4-hydroxyphenyl) propionate] pentaerythritol (anti-oxide agent 1010) | 1 |
| Vinyltrimethoxysilane (Silane coupling agent A-171) | 0.5 |

The above-mentioned components are fully mixed and put into the extruder. The temperature of the extruder is 110° C., and the temperature of the mold is 110° C. The mixed components are extruded into a film by a T-shaped flat mold. The film is then reeled up and irradiated to form a pre-crosslinked ethylene-vinyl acetate resin film. The thickness of EVA film is 2 mm, and a single reel length is 200 m. A 3-inch paper core is used to reel the EVA film up.

A reeled EVA film is expanded and placed under an X-ray generator and then reeled onto another 3-inch paper core. The irradiation includes electron beam having accelerator energy of 200 MeV, and having a radiation dosage of 30 KGY. After the irradiation, the thickness of the pre-crosslinked film takes 20% of the total thickness of the film. A top layer of 0.3 mm of the EVA film is used to measure degree of crosslinking, which is measured to be in the range of 20%-35%.

Placing the pre-crosslinked EVA film described in Embodiment 1 on the backside of the double-glazing solar module cell, the crosslinked surface is placed on the side of the cells, the uncrosslinked surface is placed on the lower glass and in contact with glass. The front of the cells is covered with the normal transparent EVA film. The solar module cell with the film is placed between two pieces of glasses with the same size, and then all-together is placed into a laminating machine that produces the solar photovoltaic modules, vacuumed for 6 minutes, meanwhile heated to 200° C., and pressurized for 15 minutes. In the laminate, the adhesive force between the EVA film of Embodiment 1 and the glass is greater than 70 N/cm. The interface between EVA film of Embodiment 1 and EVA film on the upper of the cells is optically clear, the lower film does not migrate to the upper of the cells for the EVA film of Embodiment 1.

Embodiment 17

| Ingredient | Weight Percentage |
| --- | --- |
| EVA resin, VA content of 28% | 78 |
| Ultra-fine barium sulfate (4000 mesh) | 19.5 |
| Cyanuric acid triallyl (TAC) | 0.5 |
| Peroxy-2-ethylhexyl carbonate, t-butyl (TBEC) | 1 |
| Sebacate (2,2,6,6-tetramethyl-4-piperidyl) ester (antioxidant 770) | 0.5 |
| 3-methacryloxy propyl trimethoxysilane (A-174) | 0.5 |

The above-mentioned components are fully mixed and put into the extruder. The temperature of the extruder is 90° C., and the temperature of the mold is 90° C. The mixed components are extruded into a film by a T-shaped flat mold. The film is then reeled up. The obtained uncrosslinked EVA film's thickness is 0.1 mm, and a single reel length is 100 m. A 3-inch paper core is used to reel the uncrosslinked EVA film up.

The reeled EVA film is expanded and placed under the electron beam generator, and then reeled onto another 3-inch paper core. The radiation is electron beam radiation having accelerator energy of 50 keV and a radiation dosage of 30 KGY. After the radiation, the thickness of the film on the pre-crosslinked portion is 40% of the total thickness of the film. Since the film is too thin and hard to be peeled off. The crosslinking degree of the whole film is measured and the whole crosslinking degree of the EVA film is between 10%-15%. The pre-crosslinked film is cut into a size of the double-glazing and placed between the double-glazing, vacuumed and pressurized to laminate, and then heated to 150° C. for 10 minutes. The adhesive force between EVA film and glass is larger than 80 N/cm. The EVA film overflows out of the edge of the double-glazing for smaller than 2 mm.

Embodiment 18

Various embodiments provide encapsulation assembly using pre-crosslinked polyolefin film. The present disclosure is described using solar photovoltaic cell component as one example of the encapsulation assemblies.

Figure 2:
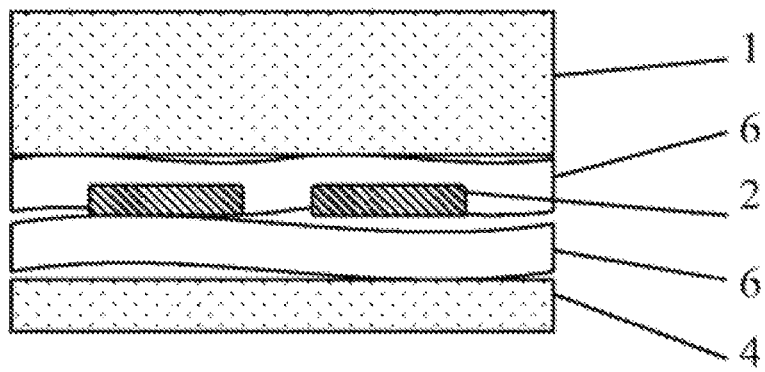
FIG. 2 illustrates another exemplary encapsulation assembly using radiation pre-crosslinked polyolefin film in accordance with various embodiments in the present disclosure.
Figure 3:
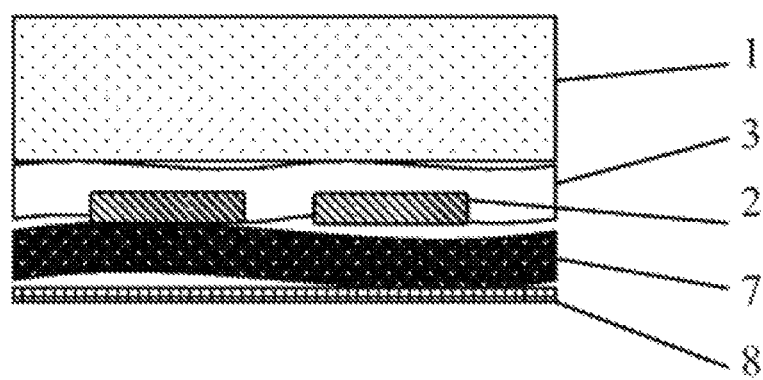
FIG. 3 illustrates another exemplary encapsulation assembly using radiation pre-crosslinked polyolefin film in accordance with various embodiments in the present disclosure.

In FIGS. 1 to 3, the exemplary solar photovoltaic cell assembly includes a rear portion encapsulation layer of the front glass 1, a two-layer film between the encapsulation layer and the front glass 1, and at least one layer of the two-layer film is a pre-crosslinked film that is radiated by electron beam, γ-ray, X-ray, an α-ray and/or neutron ray. The pre-crosslinking degree of the pre-crosslinked film is between 3%-74%. The thickness of pre-crosslinked film is consistent with the common film of the photovoltaic cells, and the thickness is from 0.1 mm to 2 mm. Preferably, the thickness is between 0.3 mm and 0.7 mm.

Compared with non-pre-crosslinked film, the pre-crosslinked film has already formed a certain crosslinked network before using, the heat resistance is greatly improved, the resin of flow is reduced, and a melting temperature increases or disappears. During the lamination process of the component manufacturing, the phenomenon that the film spills around the glass significantly reduces. If a transparent film and a color film are used at the same time, the boundary between the two layers of film is clear.

The crystalline silicon solar cell 2 or CIGS cells (thin-film solar cells) are provided between the layers of the films.

The film includes a layer of EVA film and a layer of pre-crosslinked EVA film, and the EVA film is set near the front glass. The two layers of film are pre-crosslinked POE film.

Rear portion encapsulation layer is backplane or rear glass. Backplane or rear glass, can be thinly conventional photovoltaic modules rear glass or photovoltaic modules backplane, but also can be other material that has the function of support, such as PMMA film (polymethyl methacrylate membrane material, polyamide imide film or sheet, PVC (polyvinyl chloride) profiles, metal sheet and even stone etc.

As shown in FIG. 1, the structure of photovoltaic module from front-to-rear includes: front glass 1, transparent EVA film 3 (not pre-crosslinked, the content of VA is 28%), crystal silicon solar cell 2, white pre-crosslinked EVA film 5 (pre-crosslinking degree of 74%, reflectivity of 88%), and rear glass 4. After laminating the structure under 145° C., the degree of crosslinking between transparent EVA film 3 and the white pre-crosslinked EVA film 5 is greater than 80%. The interface between the transparent EVA film 3 and white pre-crosslinked EVA film 5 is clear, the lower white pre-crosslinked EVA film 5 does not penetrate into the transparent EVA film layer 3, or turn to the crystalline silicon solar cell 2.

As shown in FIG. 2, another structure of photovoltaic module from front-to-rear includes: front glass 1, transparent pre-crosslinked POE film 6 (pre-crosslinking degree of 3%), crystal silicon solar cell 2, transparent pre-crosslinked POE film 6 (pre-crosslinking degree of 15%), and rear glass 4. After laminating the structure under 145° C., the dimensional stability of transparent pre-crosslinked POE film 6 is stable, and the film material spilled from glass around after lamination is rare.

As shown in FIG. 3, another structure of photovoltaic module from front-to-rear includes: front glass 1, transparent EVA film 3, crystal silicon solar cell 2, black pre-crosslinked EVA film 7 (pre-crosslinking degree of 35%), and back plate 8 (TPE structure back plate). After laminating the structure under 145° C., the boundary between the transparent EVA film 3 and black pre-crosslinking EVA film 7 is clear, the lower black pre-crosslinked EVA film 7 does not penetrate into the transparent EVA film layer 3, or turn to the crystalline silicon solar cell 2.

The solar photovoltaic modules using the structure, the structure of the photovoltaic modules using the pre-crosslinked film, and its application in solar photovoltaic modules, can achieve the effect of reducing the overflow around the film. If using the transparent film in the upper layer and colored film in the lower layer, at least one of the film is pre-crosslinked film, two layers of the films do not penetrate, which can remain a clear boundary effects.

While certain embodiments have been described, these embodiments have been presented by preferred Embodiment only, and are not intended to limit the scope of the inventions. The substance of the technical content of the present invention is broadly defined scope of the claims in the application, the accompanying of claims and their equivalents are intended to cover such forms or modifications as would fall within the scope and spirit of the inventions.

What is claimed is:

1. A method for preparing a radiation pre-crosslinked polyolefin film for encapsulation, comprising:
    preparing a film after mixing polyolefin raw materials together;
    using a radiation energy source to irradiate the film, wherein the radiation energy source includes one or more of β rays, γ rays, X rays, α rays, and neutron rays and directly stimulates a crosslinking reaction of the polyolefin raw materials;
    adjusting an irradiation dosage of the radiation energy source, such that a crosslinking degree of a pre-crosslinked portion of the film reaches about 3% to about 95%; and
    adjusting the irradiation dosage of the radiation energy source, such that the pre-crosslinked portion of the film has a thickness of about 5% to about 100% by a total thickness of the film, wherein: that the pre-crosslinked portion has the thickness of about 100% by the total thickness of the film means the film is all pre-crosslinked.

2. The method for preparing the radiation pre-crosslinked polyolefin film for encapsulation according to claim 1, wherein:
    the pre-crosslinked portion in the film forms at least one surface layer of the film.

3. The method for preparing the radiation pre-crosslinked polyolefin film for encapsulation according to claim 1, wherein the step of preparing the film after mixing the polyolefin raw materials together includes:
using a T-shaped flat mold to extrude for forming the film, or
using two casting rollers for forming the film.

4. The method for preparing the radiation pre-crosslinked polyolefin film for encapsulation according to claim 3, wherein:
a temperature for forming the film is about 70° C. to about 200° C., and
a mold temperature is about 70° C. to about 200° C.

5. The method for preparing the radiation pre-crosslinked polyolefin film for encapsulation according to claim 1, wherein:
the step of adjusting the irradiation dosage of the radiation energy source is performed on the film that is laminated or expanded.

6. The method for preparing the radiation pre-crosslinked polyolefin film for encapsulation according to claim 1, wherein:
the film is a polyolefin film including an ethylene-vinyl acetate (EVA) resin film.

7. The method for preparing the radiation pre-crosslinked polyolefin film for encapsulation according to claim 6, wherein the EVA resin film includes:
an EVA resin of about 51 parts to about 99.58 parts by weight,
organic peroxide crosslinking agents of about 0.3 part to about 2 parts by weight,
assistant crosslinking agents of about 0.01 part to about 5 parts by weight,
antioxidants of about 0.1 part to about 2 parts by weight,
silane coupling agents of about 0.01 part to about 2 parts by weight,
pigments of about 0 part to 40 parts by weight, and
a polyolefin elastomer of about 0 part to about 40 parts by weight; and
wherein:
the irradiation dosage is about 0.2 KGY to about 100 KGY, and
when the film is all pre-crosslinked, the crosslinking degree of the EVA resin film is about 5% to about 74%.

8. The method for preparing the radiation pre-crosslinked polyolefin film for encapsulation according to claim 7, wherein:
the radiation pre-crosslinked EVA resin film includes a single layer, double layers, or multiple layers that are co-extruded, and
the radiation pre-crosslinked EVA resin film has a thickness of about 0.1 mm to about 2 mm.

9. The method for preparing the radiation pre-crosslinked polyolefin film for encapsulation according to claim 7, wherein:
the organic peroxide crosslinking agents include one or more of dialkyl peroxides, alkyl aryl peroxides, diaryl peroxides, hydrogen peroxides, diacyl peroxides, peroxy esters, ketone peroxide, peroxycarbonate, and peroxy ketals.

10. The method for preparing the radiation pre-crosslinked polyolefin film for encapsulation according to claim 7, wherein:
the assistant crosslinking agents include one or more of acrylics, methacrylics, acrylamides, allyls, and epoxy compounds.

11. The method for preparing the radiation pre-crosslinked polyolefin film for encapsulation according to claim 1, wherein:
the film includes a polyolefin film including a polyolefin elastomer film.

12. The method for preparing the radiation pre-crosslinked polyolefin film for encapsulation according to claim 11, wherein the polyolefin elastomer film includes:
a polyolefin elastomer of about 69 parts to about 99.8 parts by weight,
assistant crosslinking agents of about 0.01 part to about 5 parts by weight,
antioxidants of about 0.01 part to about 2 parts by weight,
silane coupling agents of about 0 part to about 2 parts by weight,
organic peroxide crosslinking agents of about 0 part to about 2 parts by weight, and
pigments of about 0 part to about 20 parts by weight,
wherein:
the polyolefin elastomer includes one or more copolymers of ethylene with one or more of butene, pentene, hexene, and octene,
when the film is all pre-crosslinked, the crosslinking degree of the polyolefin elastomer film is about 3% to about 70%, and
the irradiation dosage is about 10 KGY to about 200 KGY.

13. The method for preparing the radiation pre-crosslinked polyolefin film for encapsulation according to claim 12, wherein:
the assistant crosslinking agent includes one or more of triallyl isocyanurate, cyanuric acid triallyl, trimethylol propane triacrylate, and trimethylol propane trimethacrylate.

14. The method for preparing the radiation pre-crosslinked polyolefin film for encapsulation according to claim 12, wherein:
the organic peroxide crosslinking agents include one or more of dicumyl peroxide, peroxy-2-ethylhexyl carbonate t-butyl, and 2,5-dimethyl-2,5-bis (t-butylperoxy) hexyl.

15. The radiation pre-crosslinked polyolefin film for encapsulation prepared by the method according to claim 1, wherein:
the crosslinked portion of a polyolefin film formed after the irradiation by the radiation energy source has a thickness of about 5% to about 100% by the total thickness of the polyolefin film,
that the pre-crosslinked portion has the thickness of about 100% by the total thickness of the polyolefin film means the polyolefin film is all pre-crosslinked, and
the pre-crosslinked portion has a crosslinking degree of about 3% to about 95%.

16. The radiation pre-crosslinked polyolefin film for encapsulation according to claim 15, wherein:
the crosslinked portion in the polyolefin film is a surface layer of the polyolefin film.

17. The radiation pre-crosslinked polyolefin film for encapsulation according to claim 15, wherein:
the polyolefin film is an ethylene-vinyl acetate (EVA) resin film.

18. The radiation pre-crosslinked polyolefin film for encapsulation according to claim 17, wherein the EVA resin film includes:
an EVA resin of about 51 parts to about 99.58 parts by weight,
organic peroxide crosslinking agents of about 0.3 part to about 2 parts by weight, assistant crosslinking agents of about 0.01 part to about 5 parts by weight,
antioxidants of about 0.1 part to about 2 parts by weight,
silane coupling agents of about 0.01 part to about 2 parts by weight,
pigments of about 0 part to 40 parts by weight, and
a polyolefin elastomer of about 0 part to about 40 parts by weight; and
wherein:
when the film is all pre-crosslinked, the crosslinking degree of the EVA resin film is about 5% to about 74%.

19. The radiation pre-crosslinked polyolefin film for encapsulation according to claim 17, wherein:
the radiation pre-crosslinked EVA resin film includes a single layer, double layers, or multiple layers that are co-extruded, and
the radiation pre-crosslinked EVA resin film has a thickness of about 0.1 mm to about 2 mm.

20. The radiation pre-crosslinked polyolefin film for encapsulation according to claim 18, wherein:
the EVA resin film contains VA of about 20% to about 35% by weight.

21. The radiation pre-crosslinked polyolefin film for encapsulation according to claim 18, wherein:
the organic peroxide crosslinking agents include one or more of dialkyl peroxides, alkyl aryl peroxides, diaryl peroxides, hydrogen peroxides, diacyl peroxides, peroxy esters, ketone peroxide, peroxycarbonate, and peroxy ketals.

22. The radiation pre-crosslinked polyolefin film for encapsulation according to claim 18, wherein:
the assistant crosslinking agents include one or more of acrylics, methacrylics, acrylamides, allyls, and epoxy compounds.

23. The radiation pre-crosslinked polyolefin film for encapsulation according to claim 18, wherein:
the antioxidants include one or more of light stabilizers, UV absorbers, and thermal oxidative aging decomposers.

24. The radiation pre-crosslinked polyolefin film for encapsulation according to claim 18, wherein:
the silane coupling agent includes an organic silicon compound that contains two chemical groups having different chemical properties.

25. The radiation pre-crosslinked polyolefin film for encapsulation according to claim 18, wherein:
the pigments are additives capable of changing a color of the EVA resin film, and
the pigments include one or more of carbon blacks, lithopone, zinc sulfide, titanium dioxide, and glass beads.

26. The radiation pre-crosslinked polyolefin film for encapsulation according to claim 18, wherein:
the polyolefin elastomer includes a carbon-carbon chain resin that is mixed with EVA, and
the polyolefin elastomer includes one or more of a low-density polyethylene, a copolymer of ethylene and butene, and a copolymer of ethylene and octene.

27. The radiation pre-crosslinked polyolefin film for encapsulation according to claim 18, wherein:
the polyolefin film is a polyolefin elastomer film.

28. The radiation pre-crosslinked polyolefin film for encapsulation according to claim 15, wherein the polyolefin elastomer film includes:
a polyolefin elastomer of about 69 parts to about 99.8 parts by weight,
assistant crosslinking agents of about 0.01 part to about 5 parts by weight,
antioxidants of about 0.01 part to about 2 parts by weight,
silane coupling agents of about 0 part to about 2 parts by weight,
organic peroxide crosslinking agents of about 0 part to about 2 parts by weight, and
pigments of about 0 part to about 20 parts by weight,
wherein:
the polyolefin elastomer includes one or more copolymers of ethylene with one or more of butene, pentene, hexene, and octene, and
when the film is all pre-crosslinked, the crosslinking degree of the polyolefin elastomer film is about 3% to about 70%.

29. The radiation pre-crosslinked polyolefin film for encapsulation according to claim 27, wherein:
the pre-crosslinked polyolefin elastomer film has a thickness of about 0.01 mm to about 1 mm.

30. The radiation pre-crosslinked polyolefin film for encapsulation according to claim 28, wherein:
the polyolefin elastomer is grafted by a polar group, or
the polyolefin elastomer and the polar group are not grafted, and
when forming the film, the polar group is added as a small molecule additive.

31. The radiation pre-crosslinked polyolefin film for encapsulation according to claim 28, wherein:
the assistant crosslinking agent includes one or more of triallyl isocyanurate, cyanuric acid triallyl, trimethylol propane triacrylate, and trimethylol propane trimethacrylate.

32. The radiation pre-crosslinked polyolefin film for encapsulation according to claim 28, wherein:
the antioxidants include one or more of phenolic antioxidants, hindered amine antioxidants, phosphorous acids, benzophenone, and benzotriazoles including [β-(3,5-di-tert-butyl-4-hydroxyphenyl)propionic acid], pentaerythritol ester, sebacate (2,2,6,6-tetramethyl-4-piperidyl)ester, N,N'-di-sec-butyl-p-phenylenediamine, and a combination thereof.

33. The radiation pre-crosslinked polyolefin film for encapsulation according to claim 28, wherein:
the silane coupling agent includes an organic silicon compound which contains two chemical groups having different chemical properties.

34. The radiation pre-crosslinked polyolefin film for encapsulation according to claim 28, wherein:
the organic peroxide crosslinking agents include thermal crosslinking organic peroxide crosslinking agents used for plastics, and
the organic peroxide crosslinking agents include one or more of dicumyl peroxide, peroxy-2-ethylhexyl carbonate t-butyl, and 2,5-dimethyl-2,5-bis (t-butylperoxy) hexyl.

35. The radiation pre-crosslinked polyolefin film for encapsulation according to claim 28, wherein:
the pigments are additives capable of changing a color of the EVA resin film, and
the pigments include one or more of carbon blacks, lithopone, zinc sulfide, titanium dioxide, and glass beads.

36. An encapsulation method of using a radiation pre-crosslinked polyolefin film, comprising:
preparing a film after mixing polyolefin raw materials together;

using a radiation energy source to irradiate the film, wherein the radiation energy source includes one or more of β rays, γ rays, X rays, α rays, and neutron rays and directly stimulates a crosslinking reaction of the polyolefin raw materials;

adjusting an irradiation dosage of the radiation energy source, such that a crosslinking degree of a pre-crosslinked portion of the film reaches about 3% to about 95%;

adjusting the irradiation dosage of the radiation energy source, such that the pre-crosslinked portion of the film has a thickness of about 5% to about 100% by a total thickness of the film, wherein: that the pre-crosslinked portion has the thickness of about 100% by the total thickness of the film means the film is all pre-crosslinked;

placing the film between a front protective layer and an encapsulation substrate, and forming an encapsulation assembly with an encapsulated body, wherein the pre-crosslinked portion of the film is in contact with the encapsulated body; and heating the encapsulation assembly to further crosslink the film to complete the encapsulation.

37. The encapsulation method of using the radiation pre-crosslinked polyolefin film according to claim 36, wherein:

the pre-crosslinked portion in the film includes at least one surface layer of the film.

38. The encapsulation method of using the radiation pre-crosslinked polyolefin film according to claim 36, wherein the step of preparing the film after mixing the polyolefin raw materials together includes:

using a T-shaped flat mold to extrude for forming the film, or using two casting rollers for forming the film.

39. The encapsulation method of using the radiation pre-crosslinked polyolefin film according to claim 38, wherein:

a temperature for forming the film is about 70° C. to about 200° C., and a mold temperature is about 70° C. to about 200° C.

40. The encapsulation method of using the radiation pre-crosslinked polyolefin film according to claim 36, wherein:

the irradiation of the radiation energy source is performed on a reel of the polyolefin film or on an expanded polyolefin film.

41. An encapsulation assembly formed by the encapsulation method of using the radiation pre-crosslinked polyolefin film according to claim 36, wherein:

the polyolefin film is placed between the front protective layer and the encapsulation substrate, the polyolefin film and the encapsulated body are included in the encapsulation assembly, and the pre-crosslinked portion of the polyolefin film is in contact with the encapsulated body.

42. The encapsulation assembly formed by the encapsulation method of using the radiation pre-crosslinked polyolefin film according to claim 37, wherein:

the encapsulation substrate is glass, ceramic, or plastic.

43. The encapsulation assembly according to claim 41, wherein:

the encapsulated body includes one or more of a crystalline silicon solar cell, a light emitting diode (LED), an organic light emitting diode (OLED), and a display device.

44. The encapsulation assembly according to claim 41, wherein:

the film includes two layers placed between the front protective layer and the encapsulation substrate, at least one of the two layers is the pre-crosslinked film, and the encapsulated body is placed between the two layers.

45. The encapsulation assembly according to claim 41, wherein:

the front protective layer is a transparent protective layer including a transparent glass, a transparent ceramics, or a transparent plastic.

46. The encapsulation assembly according to claim 41, wherein:

the film includes a layer of ethylene-vinyl acetate (EVA) film and a layer of pre-crosslinked EVA film, and the layer of the EVA film is placed adjacent to the front protective layer.

47. The encapsulation assembly according to claim 44, wherein each of the two layers is a pre-crosslinked polyolefin elastomer (POE) film.

48. The encapsulation assembly according to claim 41, wherein:

the encapsulation substrate is glass, ceramic, or plastic.

* * * * *